Dec. 19, 1961 T. M. MOORE ET AL 3,014,138

TRANSISTORIZED STANDARD PULSE GENERATOR

Filed Aug. 31, 1959

INVENTORS
THOMAS M. MOORE
BY RALPH E. REISE

ATTORNEYS

United States Patent Office 3,014,138
Patented Dec. 19, 1961

3,014,138
TRANSISTORIZED STANDARD PULSE GENERATOR

Thomas M. Moore and Ralph E. Reise, Glen Burnie, Md., assignors, by mesne assignments, to the United States of America as represented by the Secretary of the Navy Filed Aug. 31, 1959, Ser. No. 837,307
5 Claims. (Cl. 307—88.5)

Figure 1:
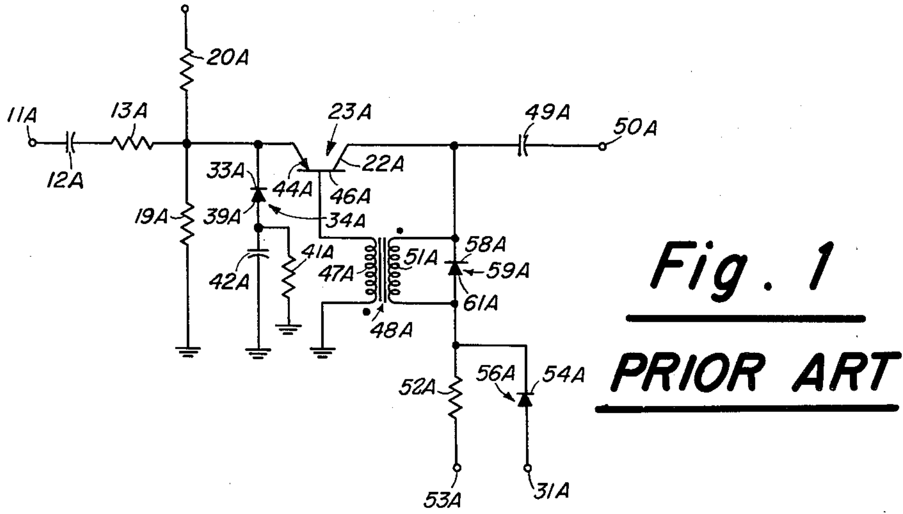
Fig. 1 PRIOR ART

The present invention relates to a transistorized standard pulse generator and more particularly to a transistorized standard pulse generator utilizing an input impedance conversion stage and positive feedback.

In equipments such as radar, television, computors and timing pulse generators a common problem has been to devise a circuit which will produce an output pulse of fixed amplitude and duration when an input voltage of a predetermined level is applied thereto. This pulse generator should accept input signals over a wide range of amplitude duration and waveform, and have a relatively high input impedance to prevent loading of the input source. The output should be a single constant-amplitude constant-width pulse at a relatively low impedance. The prior art commonly obtained these results by triggering a vacuum tube blocking oscillator. The transistorized version of the blocking oscillator has inherent limitations which the present invention overcomes. These problems in general result from the restricted voltage capabilities of transistors and the necessity to use a grounded base type of transistor circuitry, which inherently has a low input impedance. Another common shortcoming of the prior art transistorized blocking oscillators has been the tendency to refire or produce multiple pulses on long-duration, slowly rising input signals.

It is thus an object of the present invention to provide a transistorized standard pulse generator with a high input impedance.

Another object is to provide a transistorized standard pulse generator which will not be affected by excessive input voltage.

A further object of the invention is a provision of a transistorized standard pulse generator in which the tendency for double or multiple pulsing has been obviated.

According to the invention, an emitter follower transistor stage couples the input trigger to a blocking oscillator transistor stage. This, of course, has the immediate inherent function of converting the high input impedance of the triggering equipment to the low input impedance of the common base blocking oscillator stage. Another important feature is the use of a crystal diode limiter connected to the base of the emitter follower stage so that regardless of the amplitude of the input signal, neither transistor can be overloaded. A third novel feature of the present invention is the use of positive feedback between the output of the transistor blocking oscillator and the input of the emitter follower stages. This insures that, regardless of the amplitude of the input, once the blocking oscillator is triggered, the emitter follower will see a maximum voltage at the base, limited again by the diode limiter placed in the base circuit. Double pulsing is prevented by the use of a long-time constant RC network interposed between the emitter follower and the blocking oscillator which rejects any input for a predetermined time following blocking oscillator pulsing.

Figure 2:
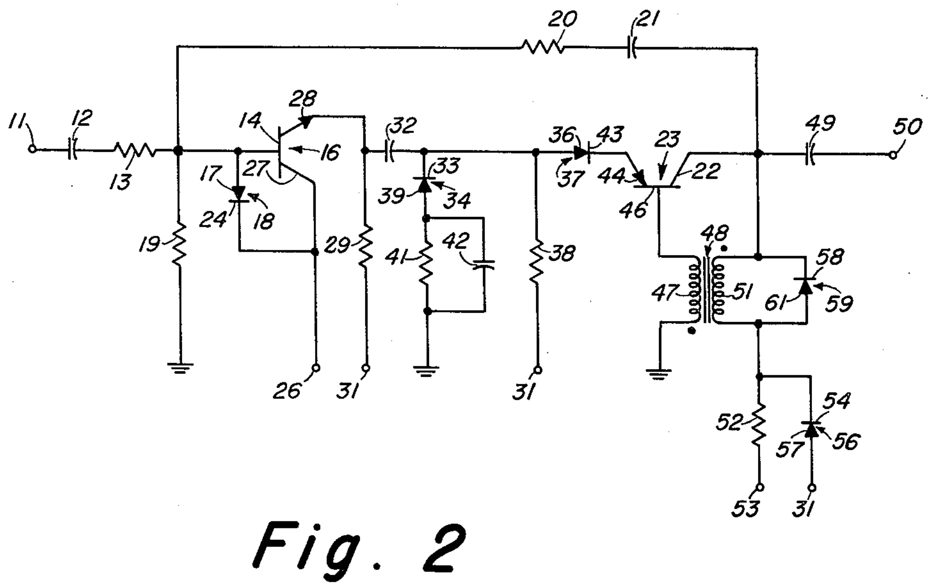

Other objects and many of the attendant advantages of this invention will be readily appreciated when the same becomes better understood by reference to the following detailed description when considered in connection with the accompanying drawings in which like reference numerals designate like parts throughout the figures thereof and wherein;

FIG. 1 is a schematic diagram of a typical prior art transistorized standard pulse generator; and FIG. 2 is a schematic representation of a preferred embodiment of the invention.

Referring now to FIG. 1 of the drawings, input terminal 11A is coupled through capacitor 12A and resistor 13A to the junction of resistors 19A and 20A, the other side of resistor 19A being connected to ground and the other side of resistor 20A being connected to the negative supply. The junction of resistors 19A and 20A is also connected to emitter 44A of transistor 23A and to cathode 33A of diode 34A. Anode 39A of diode 34A is connected thru resistor 41A and capacitor 42A in parallel to ground. Base 46A of transistor 23A is connected thru secondary winding 47A of transformer 48A to ground. Collector 22A of transistor 23A is connected thru capacitor 49A to output terminal 50A and thru primary winding 51A of transformer 48A to the junction of resistor 52A and rectifier 56A. Also connected to collector 22A is cathode 58A of diode 59A, the anode 61A being connected to the junction of resistor 52A and diode 56A. The other side of resistor 52A is connected to negative supply 53A, and anode 57A of diode 56A is connected to supply voltage 31A.

Referring now to FIG. 2 of the drawings, input terminal 11 is connected thru capacitor 12 and resistor 13 to base 14 of transistor 16. Base 14 of transistor 16 is also connected to anode 17 of diode 18, thru resistor 19 to ground, and thru resistor 20 and capacitor 21 to collector 22 of transistor 23. Cathode 24 of diode 18 is connected to positive terminal 26. Collector 27 of transistor 16 is also connected to positive terminal 26. Emitter 28 of transistor 16 is connected thru resistor 29 to negative terminal 31 thru capacitor 32 to cathode 33 of diode 34 and anode 36 of diode 37, and thru resistor 38 to negative terminal 31. Anode 39 of diode 34 is connected thru resistor 41 and capacitor 42 in parallel to ground. Anode 43 of diode 37 is connected to emitter 44 of transistor 23. Base 46 of transistor 23 is connected to winding 47 of transformer 48 to ground. Collector 22 of transistor 23 is connected thru capacitor 49 to output terminal 50, thru winding 51 of transformer 48, and resistor 52 to negative terminal 53. Connected to the junction of winding 51 and resistance 52 is cathode 54 of diode 56, the anode 57 of diode 56 being connected to negative terminal 31. Collector 22 of transistor 23 is also connected to cathode 58 of diode 59. Anode 61 of diode 59 is connected to cathode 54 of diode 56.

Referring again to FIG. 1 of the drawings there is shown a typical prior art blocking oscillator. Transistor 23A is quiescently held at cutoff by the voltage divider consisting of resistors 19A and 20A, i.e., the emitter voltage at the junction of these two resistors is not high enough in a positive direction to cause conduction with a grounded base. Capacitor 42A assumes a negative charge equal to the voltage at the junction of resistors 19A and 20A when transistor 23A is in its initial cutoff state. Upon application of a positive input trigger, capacitor 12A will charge thru resistor 19A rendering the common junction of resistors 13A, 19A, and 20A much more positive. This higher voltage will cause conduction from negative supply 53A thru resistor 52A, primary winding 51A of transformer 48A, collector 22A and emitter 44A of transistor 23A. When transistor 23A starts to conduct a positive feedback is coupled across transformer 48A to base 46A of transistor 23A. This increases conduction thru transistor 23A which increases current thru the primary 51A of transformer 48A, and a sharp positive front of current is produced thru transistor 23A. When transistor 23A reaches current saturation the feedback across transformer 48A is no longer present and current thru transistor 23A decreases. This decrease in current is fed back to base 46A, tending to decrease the current still further until the original cutoff condition is reached.

During the time transistor 23A is pulsing it presents a very low impedance across resistor 20A, i.e., the collector to emitter impedance which is effectively shorting resistor 20A. This renders the junction of resistors 19A and 20A more negative than the quiescent condition which charged capacitor 46A thru diode 39A, and results in a much higher negative charge on capacitor 42A. When transistor 23A has returned to its cutoff condition, capacitor 42A has charged up to a highly negative voltage which will not allow transistor 23A to pulse under ordinary circumstances, since this is the path thru which most of the emitter current will flow upon blocking oscillator pulsing. At this time capacitor 42A begins discharging thru resistor 41A. If, however, the input pulse has caused blocking oscillator 23A to fire before its maximum positive peak is reached, a further maximum positive peak could raise the voltage across 20A to the point where the transistor 23A would begin conducting. If the voltage were high enough to overcome the remaining charge on capacitor 42A, a second transistor pulsing would occur which obviously would be undesirable. Also undesirable in the FIG. 1 transistor blocking oscillator is the necessity of series resistance 13A to raise the input impedance of the common base transistor. This necessitates a higher level input trigger for positive blocking oscillator action. Diode 59A is utilized to clip the negative half of the blocking oscillator waveform, and resistor 52A and diode 56A are utilized as voltage regulating expedients.

Referring again to FIG. 2 of the drawings the shortcomings of the FIG. 1 blocking oscillator have been obviated by the addition of an emitter follower stage shown at 16, with certain refinement to be described in detail at this point.

The main purpose of utilizing an emitter follower stage between the input trigger and the blocking oscillator is, of course, to present a high input impedance to the triggering equipment, and a low impedance to the common base blocking oscillator. Since the blocking oscillator itself works in identical fashion to the blocking oscillator of the prior art, a detailed description of its operating characteristics is not deemed necessary. Input capacitor 12 charges thru resistors 13 and 19 when a positive trigger is applied to input terminal 11. If the voltage divider characteristics of resistors 13 and 19 are not desired, resistor 19 can be placed at the junction of capacitor 12 and resistor 13. Rectifier 18 is connected between the base 14 and collector 27 of transistor 16 to limit the input signal to the collector voltage, which in the preferred embodiment is 25 volts. Thus, if the base attempts to go above 25 volts it will be clamped by conduction thru rectifier 18, the anode 17 of diode 18 being connected to the base and the cathode 24 of diode 18 being connected to the collector. The output of transistor 16 appears as a positive voltage at the junction of capacitor 32 and resistor 29. This positive voltage will cause capacitor 32 to charge thru resistor 38. The positive voltage will then cause transistor 23 to pulse in the same manner that transistor 23A pulsed in FIG. 1. The output of transistor 23 is taken thru capacitor 49 to output terminal 50, and fed back thru capacitor 21 and resistor 20 to base 14 of transistor 16. At base 14 a positive voltage in a bootstrap arrangement will be seen from the output of blocking oscillator 23. This is to insure that any pulse capable of triggering blocking oscillator 23 will be fed back and appear at the input as a maximum amplitude pulse, which, again, will be limited by diode 18. Thus, regardless of the size of pulse at the input, the emitter follower will always see a constant amplitude pulse. This will cause capacitor 32 to charge to a predetermined maximum voltage. Between blocking oscillator pulses capacitor 32 must discharge thru resistors 29 and 38. Since capacitor 32 and resistor 29 have a large time constant the system will then be incapable of firing again regardless of the size of the input voltage. Another restriction, of course, will be the discharge time of capacitor 42 and resistor 41.

While PNP type transistors have been shown in conjunction with a negative voltage supply, obviously NPN type transistors, with a corresponding change in power supply and reversal of diode pluralities, are possible in the light of the above teachings. It is therefore to be understood that within the scope of the appended claims the invention may be practiced otherwise than as specifically described.

What is claimed is:

1. A standard pulse generator comprising first and second transistors each having at least base, emitter, and collector elements, a source of D.C. having positive, negative and neutral output voltages, said first transistor connected for excitation to said output voltages as an emitter follower amplifier, means connecting said first transistor base element to said neutral output voltage, signal peak limiting means connected to said first transistor base element, a first capacitor connected between said first transistor emitter and said second transistor emitter elements, said second transistor connected through unidirectional coupling means to said output voltages for excitation as a common base amplifier, first and second positive feedback means connected from the output of said second transistor to said first and second transistor base elements, respectively, and a parallel RC network connected in series with said unidirectional coupling means.

2. The standard pulse generator of claim 1 wherein said signal peak limiting means comprises a diode semiconductor.

3. The standard pulse generator of claim 2 wherein said unidirectional coupling means comprises a diode semiconductor.

4. The standard pulse generator of claim 3 wherein said first positive feedback means comprises a resistor and capacitor in serial relationship.

5. The standard pulse generator of claim 4 wherein said second feedback means comprises a transformer.

No references cited.